United States Patent [19]

Cogan et al.

[11] Patent Number: 4,963,500
[45] Date of Patent: Oct. 16, 1990

[54] METHOD OF MONITORING SEMICONDUCTOR MANUFACTURING PROCESSES AND TEST SAMPLE THEREFOR

[75] Inventors: George W. Cogan, Menlo Park; Gary E. Miner, Mountain View; Lee A. Christel, Menlo Park; James F. Gibbons, Palo Alto, all of Calif.

[73] Assignee: Sera Solar Corporation, Santa Clara, Calif.

[21] Appl. No.: 151,436

[22] Filed: Feb. 2, 1988

[51] Int. Cl.$^5$ .................................... H01L 21/66
[52] U.S. Cl. ............................ 437/8; 148/DIG. 162
[58] Field of Search ......... 437/8; 148/33.2, DIG. 162

[56] References Cited

U.S. PATENT DOCUMENTS

| 4,211,488 | 7/1980 | Kleinknecht | 356/369 |
| 4,563,642 | 1/1986 | Munakata et al. | 324/158 R |
| 4,597,166 | 7/1986 | Iwai | 148/33.2 |
| 4,652,757 | 3/1987 | Carver | 250/360.1 |
| 4,668,330 | 5/1987 | Golden | 156/601 |
| 4,707,610 | 11/1987 | Lindon et al. | 250/560 |

FOREIGN PATENT DOCUMENTS 57-198640  12/1982  Japan ................................. 437/8

Primary Examiner—Olik Chaudhuri
Attorney, Agent, or Firm—Flehr, Hohbach, Test, Albritton & Herbert

[57] ABSTRACT

Method of determining contaminants in a semiconductor processing apparatus in which a high purity, high carrier lifetime semiconductor test wafer is processed and the degradation of its carrier lifetime is determined.

2 Claims, 2 Drawing Sheets

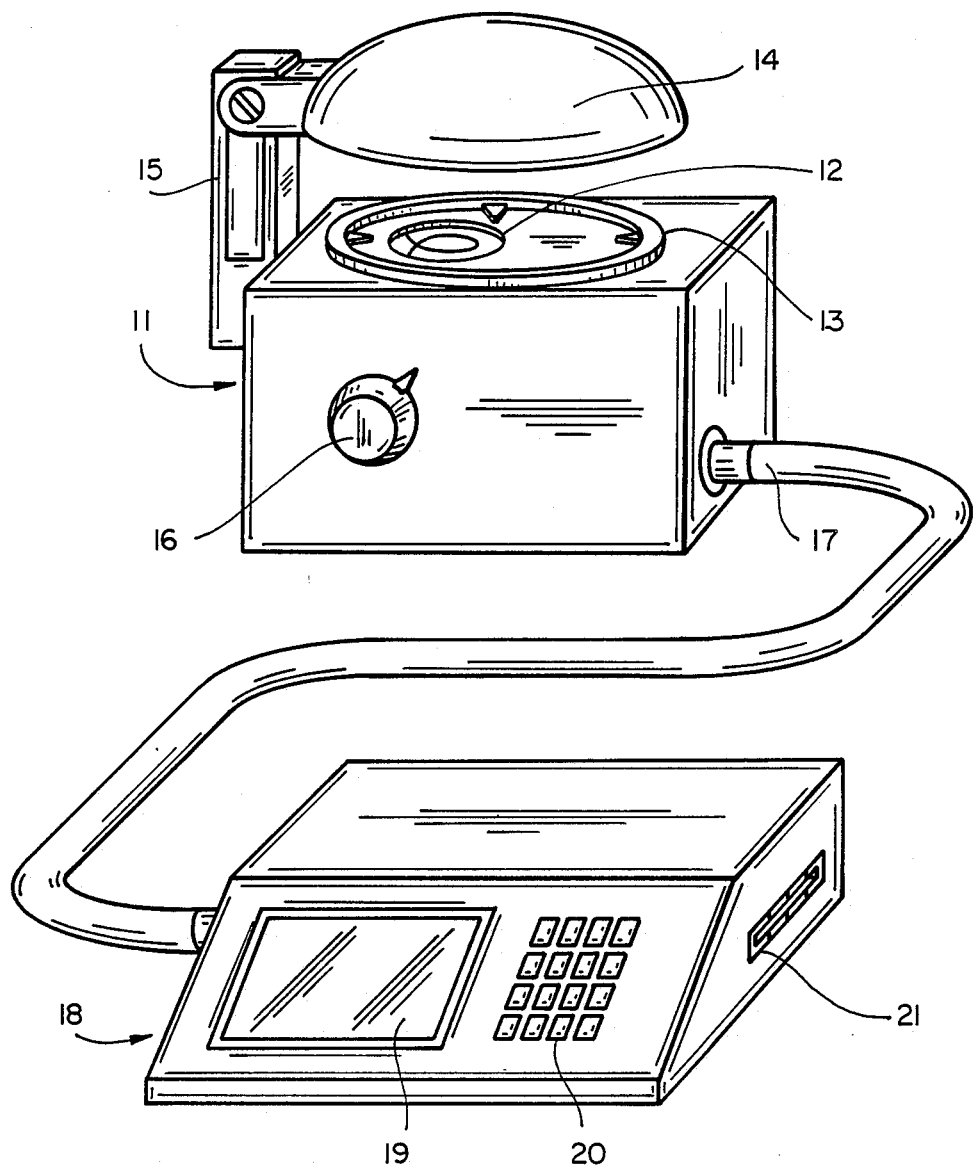
FIG_1

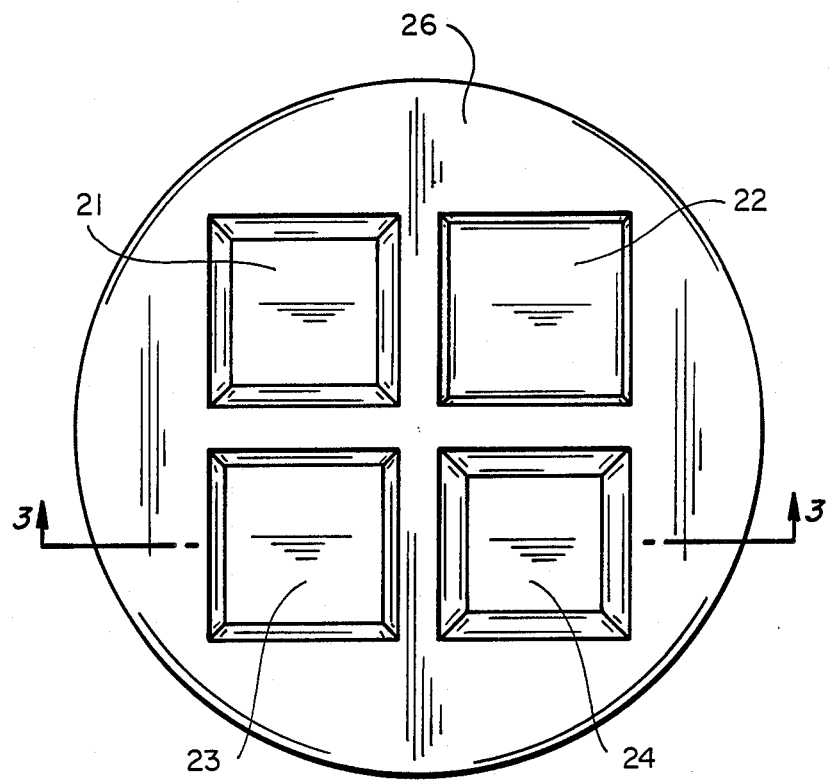
FIG_2
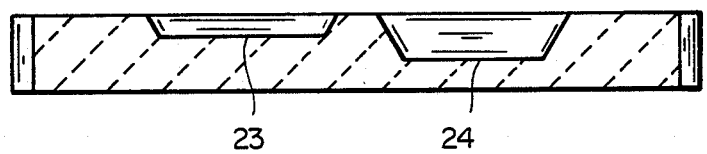
FIG_3

METHOD OF MONITORING SEMICONDUCTOR MANUFACTURING PROCESSES AND TEST SAMPLE THEREFOR

This invention relates generally to a method of monitoring semiconductor manufacturing processes and more particularly to a method which measures the degradation in carrier lifetime in a test sample due to impurities introduced in the processing and to a test sample for use therein.

In the semiconductor industry it is extremely important to maintain a clean manufacturing environment. This is particularly necessary where semiconductor wafers are processed at high temperature to yield devices and integrated circuits. Generally impurities in the process degrade the performance of the devices by reducing the bulk and surface lifetime which is fundamental to high performance of devices such as high efficiency, silicon solar cells and high gain transistors. The impurities can arise from a variety of sources. The furnace may be contaminated or the de-ionized water used in the process may contain bacteria.

Other examples, of use of the present method and test sample are to qualify a gate oxidation furnace in the CMOS process or to monitor the conditions in various steps in the progressing of devices in a run.

Accordingly, it is an object of the present invention to provide a method in which a test sample is used to either qualify the equipment prior to use or to monitor processing by measuring the changes in lifetime of carried in the bulk and surface of a test sample.

Non-contact measurement of carrier lifetimes in silicon is possible by measuring the photoconductivity delay. Photons are directed in a wafer by impinging light on the wafer from a source such as a laser or flashlamp. These photons are of an energy such that they are absorbed by the sample and converted to excess mobile carriers. The excess charge manifests itself by an increase in conductivity. The conductivity is measured by using a non-contact inductive coupling technique and apparatus such as the method and apparatus described by H. W. Curtis and R. L. Verkuil entitled "A High Signal-to-Noise Oscillator For Contactless Measurement Of Photoinduced Carrier Lifetimes" appearing in Lifetime Factors in Silicon, ASTM STP 712, American Society for Testing and Materials, 1980, pp. 210–224.

The problem in monitoring bulk lifetime and surface recombination velocity using the photoconductivity decay method is the complexity of test sample preparation. The technique in its simplest form yields a value for the total lifetime $\tau_{eff}$ due to all sources of recombination, bulk and surface recombination. In order to separate these components, several samples of different thicknesses must be processed identically and measured. Wafers as thin as 50 microns must be used to obtain accurate values of the bulk and surface components. In standard silicon processing, wafer thicknesses of 300 to 500 microns are in common use. Standard equipment will not handle thin wafers without breakage. Thus, there are two significant problems which prevent widespread use of the photoconductivity decay methods. One is the problem of having to process and measure several different thicknesses of wafers. Second, is the problem of breakage when thin samples are used in the conventional processing furnaces.

It is therefore another object of the present invention to provide a silicon test sample of standard thickness which includes regions of different thicknesses.

It is another object of the present invention to provide a sample which is tailored to measure different processing parameters.

The foregoing and other objects of the invention are achieved by a process in which degradation of the lifetime is measured by first measuring the initial surface and bulk carrier lifetime in a test sample. The test sample is then subjected to the process or equipment to be tested and thereafter the bulk and surface carrier lifetime is again measured. The amount of degradation is a measure of the process purity.

The objects are also met by providing a silicon test wafer which is of conventional thickness with areas of reduced thicknesses enabling the equipment to handle the sample and yet permitting the measurement of bulk and surface lifetime.

The foregoing and other objects will be more clearly understood from the following description taken in connection with the following drawings of which:

FIG. 1 is a schematic view of a lifetime testing system in accordance with the present invention.

FIG. 2 is a plan view of a semiconductor wafer in accordance with one embodiment of the present invention.

FIG. 3 is a sectional view of the wafer taken along line 3—3 of FIG. 2.

Referring to FIG. 1, the lifetime measuring system includes a detector assembly 11. The detector assembly includes a noncontact inductive coupling loop 12 to measure the conductivity of the sample. The detector assembly operates in accordance with the teaching in the article by Curtis and Verkuil, cited above. In essence the detector circuit sets up an oscillating magnetic field with the loop 12 positioned beneath a hole in the detector housing. The field induces eddy currents in the wafer positioned above the coil on the wafer stage 3. The energy dissipated by the eddy currents is proportional to the wafer conductivity and the amplitude of oscillation is directly proportional to the energy absorbed. The circuit filters out the high frequency oscillations to obtain a DC output voltage which is proportional to wafer conductivity. The amplitude of the signal can be controlled by control knob 16. This output voltage is applied to a digital processor 18.

The wafer stage allows the sample to be positioned so that a specific area is positioned over the detector coil 12. With custom test wafers in accordance with the present invention, this stage can be rotated to place a region of particular thickness adjacent the coil.

The system is used to measure carrier lifetime in the test sample. Excess carriers are generated by pulsed light source 14. This light source can be either a strobe lamp or a laser. As the generated carriers recombine, the conductivity falls to the nonilluminated value within a time constant defined as the carrier lifetime. Since the conductivity of the sample is proportional to the number of carriers, the detector output shows the same decay. The light source is mounted on a sliding mount 15 so that it can be lowered over the sample to shield it from external light or other radiation. The light source control circuitry, not described, is contained within the housing.

The processor and display digitizes the analog signal and performs lifetime calculations. The processor will automatically calculate the lifetime from the exponential signal input and display the value on the screen 19. The customized wafer allows determination of the source of recombination whether it is in the bulk or at the surface of the wafer. After measurement of lifetime for a number of different thickness areas of the customized wafer, it is possible to separate out the lifetime for the surface and the bulk components.

The details of the conductivity vs. time behavior yield information about several material parameters. The decay is nearly exponential and can be characterized by an effective decay time $\tau_{eff}$. decay time is related to the bulk recombination properties of the material. Under certain conditions, the decay characteristic is also very sensitive to any other sources of recombination present in the sample, such as surface, emitter, and contact recombination. In other cases, the conductivity decay is not a simple exponential and a more detailed analysis is necessary to extract the material parameters of interest.

A feature of the present invention is its ability to use the photoconductivity decay method and specially produced wafers to determine both the surface and bulk components of recombination. In order to extract these parameters from the effective lifetime, $\tau_{eff}$, the following relationships are used.

The effective lifetime at any point on the photoconductivity decay curve is defined by:

$$1/\tau_{eff} = -[dn(t)/dt]/n(t),$$

where n(t) is the mobile carrier concentration at time t.

For a standard wafer with no diffusions the effective lifetime, $\tau_{eff}$, can be separated into bulk and surface components according to the equation:

$$1/\tau_{eff} = 1/\tau_{bulk} + 2/\tau_{surface}$$

where $\tau_{surface} = W/s$. W is the sample thickness, and s is the surface recombination velocity. The factor 2 accounts for the two surfaces where recombination occurs.

Because $\tau_{surface}$ is a function of the sample thickness, the customized sample structure makes it possible to differentiate between the surface and bulk components, and the parameters $\tau_{bulk}$ and s can be extracted.

When one of the wafer surfaces contains a diffused region of opposite dopant type from the starting material (so that an emitter junction is formed), the effective lifetime equation becomes [1]:

$$1/\tau_{eff} = 1/\tau_{bulk} + 1/\tau_{surface} + 1/\tau_{emitter}$$

where $\tau_{emitter} = qWn_i^2/J_{OE}n(t)$. $J_{OE}$ is the emitter saturation current, n(t) is the mobile carrier concentration at time t, $n_i$ is the intrinsic mobile carrier concentration, and q is the electron charge. The customized wafer again allows the surface and bulk components to be differentiated. $J_{OE}$ can be determined more accurately, because the emitter term becomes more dominant as W is made smaller.

[1] R. R. King, R. A. Sinton, R. M. Swanson and T. F. Ciszek, 19th IEEE Photovoltaics Specialists Conference Proceedings, p. 1168 (1987)

When a diffusion is made on both surfaces of the wafer, the equation is:

$$1/\tau_{eff} = 1/\tau_{bulk} + 2/\tau_{emitter}$$

Again, samples of different thicknesses allow effective separation of the two recombination components.

In one embodiment, the customized sample comprises a wafer of standard thickness with regions of different thicknesses machined or etched into it. The bulk and surface recombination is determined by using only one test wafer instead of several. This simplifies the monitoring process and improves control since in effect all samples are contained on one wafer. In addition, the test wafer can be handled using the same techniques commonly employed on the processing line.

A test sample in accordance with the preferred embodiment of the invention is shown in FIGS. 2 and 3. The sample is fabricated from a wafer of high purity and high carrier lifetime silicon. An oxide or nitride layer is grown or deposited on the surface and windows are opened and etched sequentially so as to form several areas 21-24 of different thicknesses surrounded by areas 26 of standard thickness. The preferred etchant is a solution of KOH which etches silicon preferentially in the <100> direction. The regions of reduced thickness remain well defined even though the etch depth is a substantial fraction of the wafer thickness. After etching, the etched surfaces can be passivated and each region of the sample measured for effective carrier lifetime. The equations described above can then be implemented to calculate values for the bulk lifetime and the surface recombination velocity.

The specialized sample is then used to monitor a specific piece of equipment, for example, a furnace could be qualified for cleanliness each day before processing of actual devices begins. A customized sample as described above would be measured before and after exposure to the furnace. Any degradation in the bulk recombination would indicate contamination in that furnace. Since the measurement does not require deposition of metal contacts the qualification of the furnace for lifetime degradation can take place immediately after a test run is completed.

Another example might be to qualify a gate oxidation furnace in a CMOS process. In this example, the quality of the silicon/silicon oxide interface is of particular interest. In this case, the customized sample would not be pre-passivated as described above. Instead the specialized sample would be etched to a bare silicon surface before insertion in the gate furnace. The standard gate oxide would then be grown on the sample and the regions of different thicknesses would be measured for effective lifetime. The absolute value of surface recombination as determined by simple algorithms could then be used to judge the quality of the gate oxide.

In another embodiment, the specialized wafer could be used to monitor the progress and condition of a run of devices. One or more custom monitor wafers can be processed along with device wafers and measured after each step in the process. This technique would provide the integrated circuits and solar cell manufacturer with an additional quality control tool, as well as a means of understanding the processing sequence as it relates to bulk and surface lifetime degradation. This information is important in the fabrication of a large range of semiconductor devices.

Another example of use of the present invention is in measuring the presence of bacteria in deionized (DI) water. Bacteria is a known contaminant in DI water which is difficult to detect without time consuming culturing techniques. While the DI water resistivity is a good overall indicator of water purity, active bacteria can exist as deleterious contaminants without changing the conductivity of the water. Typically, a semiconductor processing company monitors the bacteria count in its DI water by taking samples periodically, incubating them for 72 hours, and then counting the multiplied bacteria with an optical microscope. The problem inherent in this technique is the turnaround time required to gather data. Should the bacteria count exceed specified concentration, there is a 72 hour delay before that information returns to the foundry and appropriate remedial action is taken. That means several runs of wafers can be adversely affected before a DI water problem is detected.

Since bacteria contamination in DI water can have a deleterious effect on carrier lifetime, the photoconductivity decay method could be used as an indirect measure of bacteria contamination in DI water. A sample of known cleanliness and lifetime is rinsed in the DI water and exposed to a high temperature cycle. A precleaned control wafer which is not exposed to the water may be included in the high temperature cycle. The carrier lifetimes are measured after the high temperature cycle and degradation (correlated to the presence of bacteria) is detected. A qualitative correlation between bacteria count and lifetime degradation for a specific quality of wafer can be determined.

A further measurement is possible when custom wafers with areas of different thicknesses are used. The multi-thickness custom wafer allows separation of bulk and surface recombination and the effect of contamination on both parameters can be measured. Bacteria-contaminated DI water and a low temperature anneal may be enough to degrade a pre-passivated surface while having a relatively small effect on bulk recombination. It is known that relatively high temperatures $>600°$ C. are required before contamination can diffuse into the bulk of the silicon and cause bulk recombination. Surface recombination can be degraded at low temperatures depending on the passivation present since the contaminant does not have to diffuse deeply. Therefore, the high temperature diffusion step may not be required to monitor bacteria count in DI water. Accordingly, a small heater could be used instead of a diffusion furnace.

More sophisticated measurements can be carried out using specialty wafers. For example, a sample with areas of different thicknesses and different surface passivation structures might provide information about different sources of contamination. Since the diffusivity of contaminants through various surface layers is known or can be determined, a structure which is more sensitive to specific contaminants or classes of contaminants can be constructed. For example, if a class of contaminant species (such as alkali metals) is known to diffuse readily through oxide, but not through nitride, a sample with oxide and oxide/nitride passivation layers can be prepared and processed through a high temperature step.

That sample can then be used to preferentially detect the presence of mobile ion contamination since the surface recombination of the oxide/nitride layers will be relatively unaffected while the oxide-only layers will show degradation from mobile ion contamination.

Another class of specialty wafers might be wafers implanted with a specific ionic species which is known to interact with the contaminant of interest. If mobile ions, such as sodium and potassium, are of interest, a sensitive measure of their presence might be a wafer implanted with chlorine. Such a wafer would provide traps for sodium and potassium and the state of the traps would influence the surface recombination properties of the sample. Their effect might be monitored using the contactless photoconductivity decay method.

Thus, there has been provided a novel process for testing semiconductor processing equipment for determining impurities in water, and for monitoring other parameters. The process comprises fabricating a test wafer which is then subjected to the process and the degradation of lifetime used to give an indication of impurities, contaminants, bacteria or other parameters of interest.

We claim:

1. The method determining contaminants in semiconductor processes which comprise forming in a wafer of high purity/high carrier lifetime semiconductor material of predetermined thickness at least one region of a thickness which is less than the said predetermined thickness to provide a test wafer, subjecting the high purity/high carrier lifetime test wafer to the semiconductor process and thereafter determining degradation of the lifetime of carriers in said region of said test wafer as a result of said process.

2. The method of determining contaminants in semiconductor processing which comprise the steps of forming in a wafer of high purity/high carrier lifetime semiconductor material of predetermined thickness a plurality of regions of different thicknesses, each of said plurality of regions having a thickness less than the predetermined thickness, measuring the carrier lifetime in each of said regions of different thicknesses, subjecting the wafer to the processing and thereafter again measuring the lifetime in each of said regions and determining the extent of degradation of the surface and bulk carrier lifetime.

* * * * *